United States Patent
Neils et al.

(10) Patent No.: US 7,155,579 B1
(45) Date of Patent: Dec. 26, 2006

(54) MEMORY CONTROLLER HAVING PROGRAMMABLE INITIALIZATION SEQUENCE

(75) Inventors: Justin S. Neils, Hudson, WI (US); John S. Jensen, Minneapolis, MN (US); Eugene A. Rodi, Minneapolis, MN (US); Merrill J. Nelson, Coon Rapids, MN (US)

(73) Assignee: Unisys Corporation, Blue Bell, PA (US)

( * ) Notice: Subject to any disclaimer, the term of this patent is extended or adjusted under 35 U.S.C. 154(b) by 524 days.

(21) Appl. No.: 10/330,991

(22) Filed: Dec. 27, 2002

(51) Int. Cl.
*G06F 12/00* (2006.01)

(52) U.S. Cl. ...................... 711/154; 711/104

(58) Field of Classification Search ............. 713/1, 713/2; 711/151, 158, 154, 104
See application file for complete search history.

(56) References Cited

U.S. PATENT DOCUMENTS

| | | | |
|---|---|---|---|
| 5,327,560 A * | 7/1994 | Hirata et al. ............. 709/221 |
| 5,768,560 A * | 6/1998 | Lieberman et al. ......... 711/167 |
| 6,553,472 B1 * | 4/2003 | Yang et al. ................ 711/167 |
| 6,859,856 B1 * | 2/2005 | Piau et al. ................ 711/103 |
| 2002/0016897 A1 * | 2/2002 | Nerl ........................ 711/170 |
| 2002/0038412 A1 * | 3/2002 | Nizar et al. ............... 711/170 |
| 2002/0095548 A1 * | 7/2002 | Mansur et al. ............. 711/114 |
| 2002/0121920 A1 * | 9/2002 | Jolin et al. ................. 327/52 |
| 2003/0084233 A1 * | 5/2003 | Williams .................. 711/105 |
| 2003/0145163 A1 * | 7/2003 | Seo et al. ................. 711/106 |
| 2004/0088472 A1 * | 5/2004 | Nystuen et al. ............. 711/5 |
| 2004/0123088 A1 * | 6/2004 | Poisner et al. .............. 713/1 |

\* cited by examiner

*Primary Examiner*—Pierre Bataille
*Assistant Examiner*—Shane M. Thomas
(74) *Attorney, Agent, or Firm*—Charles A. Johnson; Mark T. Starr; Shumaker & Sieffert, P.A.

(57) ABSTRACT

In general, techniques are described for initializing a memory module in accordance with a programmable initialization sequence. A memory controller, for example, includes a programmable computer-readable medium that stores configuration data to control initialization of one or more memory modules. The memory controller includes an initialization control unit that outputs a sequence of commands to initialize the memory modules in accordance with the configuration data. The initialization control unit may select the sequence of commands from a set of predefined initialization sequences based on the configuration data.

32 Claims, 5 Drawing Sheets

MEMORY CONTROLLER HAVING PROGRAMMABLE INITIALIZATION SEQUENCE

TECHNICAL FIELD

The invention relates to computer systems and, more particularly, techniques for initializing memory modules within computer systems.

BACKGROUND

A typical computing system includes one or more memory modules for storing software applications and program data, and a memory controller that controls access to the memory module under the direction of a microprocessor. Conventional memory modules, such as Single Inline Memory Modules (SIMMs) and Dual Inline Memory Modules (DIMMs), must be powered up and initialized with a predefined sequence of commands in order to operate properly. Failure to follow the required procedures for power up and initialization may result in undefined operation.

Most types of memory modules are designed to comply with one or more industry standards that specify a required initialization sequence for the particular memory type. Although most manufacturers of memory modules purport to conform to these industry standards, the exact initialization sequences required by the different manufacturers often have subtle variations. Two manufacturers of the same type of memory may, for example, require initialization sequences that include the same basic commands, but in a slightly different order. In addition, the manufactures may require different timings for applying the commands to the memory being initialized. For example, one manufacture may require that a command, such as a memory pre-charge command, be applied for a slightly longer or shorter duration than another manufacturer.

Conventional memory controllers are designed to apply a static initialization sequence in which the commands have of a fixed order and time duration. In other words, a memory controller may be designed to operate with a specific manufacturer. As a result, utilization of memory modules from other manufacturers may be difficult, and may require redesign of the memory controller or use of a different memory controller altogether.

In general, the invention is directed to techniques for initializing one or more memory modules in accordance with a programmable initialization sequence. More specifically, a memory controller allows a processor or other component to programmatically select or otherwise modify the initialization sequence for the memory modules.

The memory controller may receive configuration data from the processor or another component and, based on the configuration data, outputs a sequence of commands for initializing the memory modules. As one example, the memory controller may store a plurality of predefined initialization sequences, each defining a different command sequence. Based on the configuration data, the memory controller selects one of the initialization sequences, and issues the defined commands to the memory module in the order defined by the selected sequence. By adjusting the configuration data, the processor can finely control the initialization sequence applied by the memory controller. For example, the memory controller allows the processor to specify particular bit patterns to be applied to the memory module for each command. In addition, the memory controller may control the timing, duration, and other properties of the command sequence based on the configuration data.

In one embodiment, the invention is directed to a memory controller comprising a programmable computer-readable medium that stores configuration data to control initialization of one or more memory modules. The memory controller further comprises an initialization control unit that outputs a sequence of commands to initialize the memory modules in accordance with the configuration data.

In another embodiment, the invention is directed to a method comprising selecting one of a plurality of predefined initialization sequences based on programmable configuration data, and issuing commands to initialize a memory module in accordance with the selected initialization sequence.

In another embodiment, the invention is directed to a system comprising a memory module, a programmable memory controller; and a processor to provide configuration data to the memory controller to control initialization of the memory module. The memory controller outputs a sequence of commands to initialize the memory module in accordance with the configuration data.

In another embodiment, the invention is directed to a system comprising a memory module, means for selecting a sequence of commands from a set of predefined initialization sequences, and means for initializing the memory module in accordance with the selected sequence of commands.

The invention can provide a number of advantages. In general, the programmable nature of the memory controller allows the computing system to support memory modules produced by different manufacturers, which often produce memory modules that require slightly different initialization sequences. Similarly, the memory controller may easily be reprogrammed to support future modifications, such as timing changes, or extended initialization modes.

Further, the memory controller may be reconfigured at run-time, i.e., during operation of the computer, without requiring that the system be completely powered down. The memory controller may be dynamically reprogrammed to support the new memory module in the event memory module fails. This allows a new memory module to be inserted in the system without interrupting operation of the system. Consequently, the memory controller may readily support a variety of types of memory modules without needing to be redesigned or replaced.

The details of one or more embodiments of the invention are set forth in the accompanying drawings and the description below. Other features, objects, and advantages of the invention will be apparent from the description and drawings, and from the claims.

DETAILED DESCRIPTION

Figure 1:
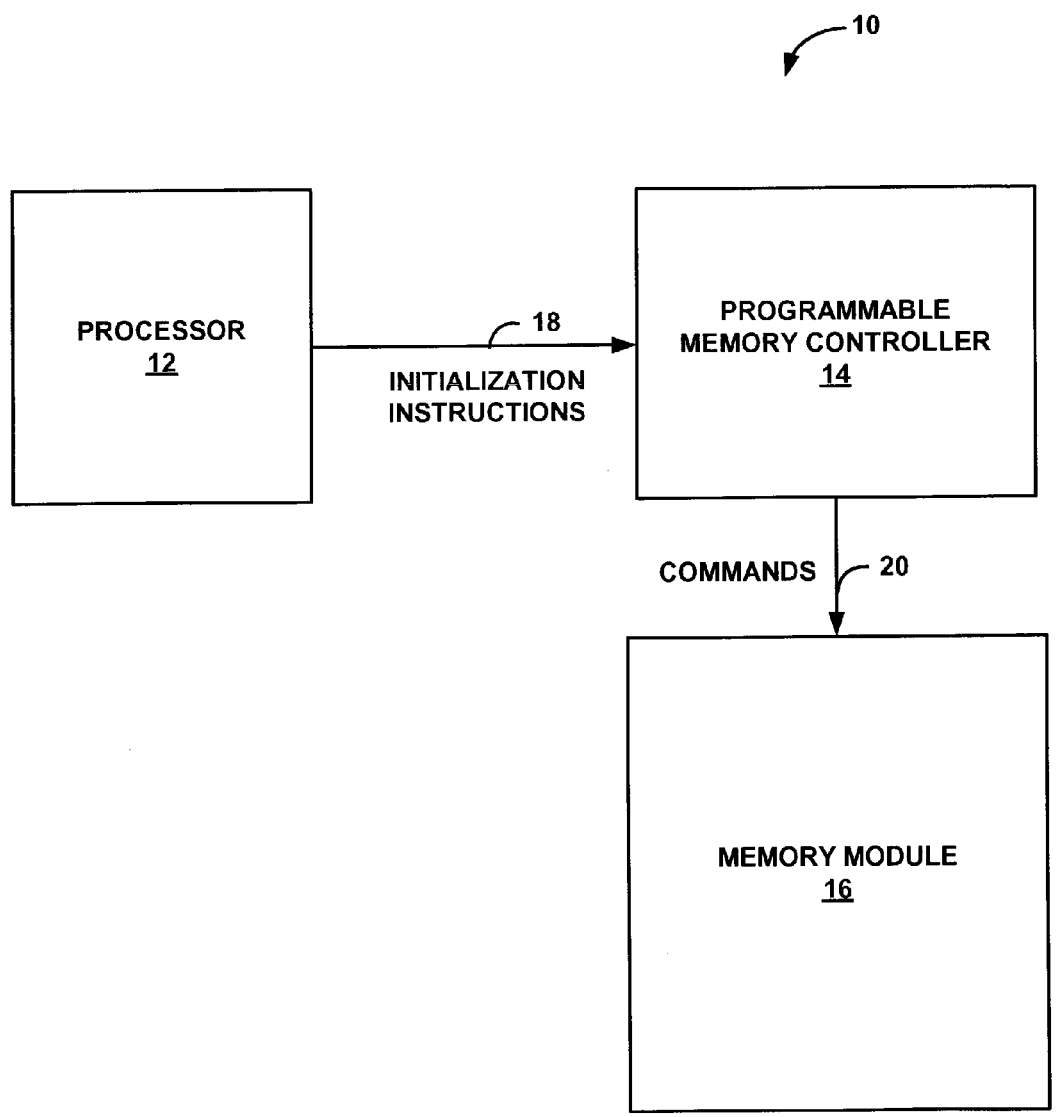
FIG. 1 is a block diagram illustrating an exemplary computing system in which a memory controller initializes a memory module in accordance with a programmable initialization sequence.

FIG. 1 is a block diagram illustrating an exemplary computing system 10. As illustrated, a processor 12 is coupled to a memory controller 14 that initializes memory module 16 in accordance with a programmable initialization sequence. As described herein, memory controller 14 allows processor 12 or other components (not shown) within system 10 to programmatically select or otherwise modify the initialization sequence for memory module 16.

As described in further detail herein, for successful operation, memory module 16 requires application of a set of commands 20 in a defined sequence shortly after power-up. Example commands typically required by a Dual Inline Memory Module (DIMM) include PRECHARGE, DELAY LOCK LOOP (DLL) ENABLE, DLL RESET, DLL RESET DE-ASSERT, DELAY, and REFRESH. In general, the PRECHARGE command directs memory module 16 to deactivate any open row. The DLL ENABLE command enables a DLL within memory module 16, which is necessary for normal operation. The DLL RESET command resets the DLL, and programs the operating parameters of memory module 16. The operating parameters may, for example, include a burst length, a burst type, and a Column Address Strobe (CAS) latency. The DLL RESET DE-ASSERT command programs operating parameters of memory module 16 without resetting the DLL. The application of the DELAY command provides a delay of a defined number of cycles within the initialization sequence. Upon encountering the DELAY command within the sequence, memory controller 14 delays for the defined number of cycles prior to issuing the subsequent command. In other words, during application of the DELAY command, no commands are issued to memory module 16. The REFRESH command initiates refresh logic to periodically refresh memory modules 16.

The programmable nature of memory controller 14 allows system 10 to support memory modules produced by different manufacturers, which often produce memory modules that require slightly different initialization sequences. Different manufacturers may, for example, require that memory controller 14 apply the initialization commands discussed above, but in slightly different orders. The slightly different order of the initialization sequences may arise due to the ambiguity in the placement of a particular command.

To accommodate for these differences, processor 12 may issue initialization instructions 18 that includes configuration data to control the sequence and timing in which commands 20 are applied to memory module 16. For instance, memory controller 14 may control the order in which commands 20 are issued in response to initialization instructions 18. As one example, memory controller 14 may modify the order of the DELAY command within the sequence in response to initialization instructions 18 from processor 12. More specifically, an industry standard may simply require that the DELAY command must be applied after a DLL RESET command, but prior to any READ command. However, according to the standard, other initialization commands 18 may be issued before or after the DELAY command is applied. As a result, some manufacturers may require that the DELAY command be applied immediately after the DLL RESET command, while others may require that the DELAY be applied as the last command in the initialization sequence, or anywhere in between these commands. The programmable nature of memory controller 14 can be used to easily accommodate any differences between manufactures with respect to these requirements.

Further, initialization instructions 18 may direct memory controller 14 to output a command sequence having additional or fewer commands 18. In other words, some manufacturers may not require a particular command in their initialization process. For instance, a manufacturer of a particular memory module may not require that the initialization sequence include a DLL RESET DE-ASSERT command. Memory controller 14 allows processor 12 to dynamically modify the presence of commands within the initialization sequence as necessary to support different memory modules 16. Further, memory controller 14 may also be programmed to change the timing and duration of the commands of the initialization sequence. For example, the amount of time between commands may be increased, the amount of time before a timeout error occurs may be shortened, or the like.

Moreover, memory controller 14 allows processor 12 to specify particular bit patterns to be applied to memory modules 16 for each command. In other words, processor 12 may tailor the exact binary pattern issued to memory modules 16 for each command. Consequently, programmable memory controller 14 provides a high-level of programmable control over the individual commands.

To simplify the programming requirements, memory controller 14 may be preprogrammed or otherwise store a plurality of predefined initialization sequences, e.g., different initialization sequences necessary to support a number of manufactures. Memory controller 14 may store the sequences within a computer-readable medium, such as a read-only memory (ROM), random access memory (RAM), Flash memory, and the like.

In response to initialization instructions 18, memory controller 14 may select one of the predefined initialization sequences, and apply commands 20 in accordance with the selected sequence. In this manner, memory controller 14 may be compatible with memory modules from manufacturers that utilize different initialization sequences, unlike conventional systems in which the initialization sequence is typically fixed in hardware logic.

Advantageously, memory controller 14 may be reconfigured at run-time without requiring that system 10 be completely powered down. In other words, in the event memory module 16 fails, a new memory module may be inserted, and memory controller 14 may be dynamically reprogrammed to support the new memory module.

By providing the described flexibility, memory controller 14 allows fine control over the initialization sequence, thereby ensuring compliance with any requirements specified by a manufacturer of memory module 16. Consequently, memory controller 14 may readily support a variety of types of memory modules without needing to be redesigned or replaced.

Processor 12 may be any type of control unit capable of executing machine instructions from a computer-readable storage medium. For example, processor 12 may belong to the PENTIUM® family of microprocessors manufactured by the Intel Corporation of Santa Clara, Calif. However, other microprocessors can be used, such as the MIPS® family of microprocessors from the MIPS Corporation, the POWERPC® family of microprocessors from both the Motorola Corporation and the IBM Corporation, the ALPHA® or PRECISION ARCHITECTURE® family of microprocessors from the Hewlett-Packard Company, the SPARC® family of microprocessors from the Sun Microsystems Corporation, and the like. In various configurations, system 10 represents any server, personal computer, laptop or even a battery-powered, pocket-sized, a hand-held PC or personal digital assistant (PDA) or other mobile computing device, e.g., a mobile phone, and the like.

Further, memory module 16 may be any type of memory that requires application of a defined sequence of commands prior to operation. For example, memory module 16 may comprise a Single Inline Memory Modules (SIMMs). Dual Inline Memory Modules (DIMMs), or the like. Other example types of memories include read only memory (ROM), random access memory (RAM), electrically erasable programmable read-only memory (EEPROM), Flash memory, Synchronous Dynamic Random Access Memory (SDRAM), and the like.

Figure 2:
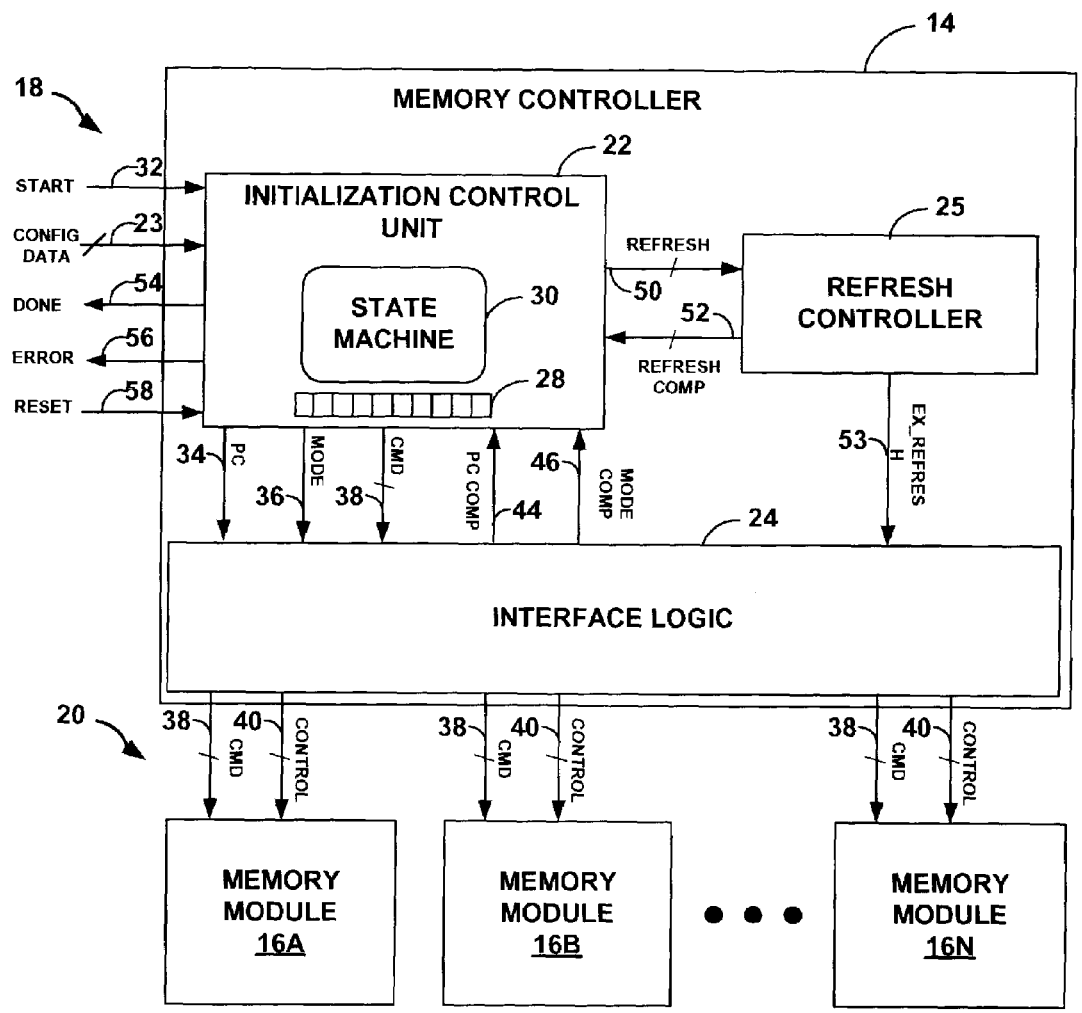
FIG. 2 is a block diagram illustrating an exemplary embodiment of the memory controller of FIG. 1.

FIG. 2 is a block diagram illustrating an exemplary embodiment of memory controller 14. In the illustrated embodiment, memory controller 14 initializes memory modules 16A–16N ("memory modules 16") in accordance with a programmable initialization sequence. Memory controller 14 includes an initialization control unit 22, interface logic 24, and refresh controller 25. Initialization control unit 22 receives initialization instructions 18, including configuration data 23, and stores configuration data 23 in a programmable register 28 or other computer-readable medium to control the application of commands 20 to memory modules 16.

In general, state machine 30 access configuration data 23 stored within register 28, and controls the application of commands 20 in accordance with configuration data 23. As illustrated in detail below, state machine 30 includes a plurality of states that control the issuance of commands 20 to memory modules 16. State machine 30 transitions through the states in a certain order based on configuration data 23. As state machine 30 transitions through the states, initialization control unit 22 outputs the sequences of commands for distribution to memory modules 16 by interface logic 24. In this manner, memory controller 14 controls the sequence in which commands 20 are issued to each of memory modules 16 in response to configuration data 23.

Initially, initialization control unit 22 receives a start signal 32 and configuration data 23 from processor 12, or another component within the memory architecture of system 10. Initialization control unit 22 stores configuration data 23 in register 28. As one example, configuration data 23 may take the form of a binary string having a number of predefined fields. Configuration data 23 may include data to control selection of the particular command sequence, as well as initialization control bits that define properties of the initialization sequence, such as duration and timing for application of the commands.

In one embodiment, initialization control unit 22 identifies a set of mode bits within configuration data 23, and selects a pre-defined initialization sequence in accordance with the state mode bits. For example, configuration data 23 may include two mode bits that are associated with four pre-defined sequences of commands. Based on the value of the state mode bits, initialization selects one of the pre-defined command sequences, and issues commands to interface logic 24 in accordance with the selected sequence. The mode bits may, for example, correspond to different manufactures, and provide a manufacturer code for selecting an initialization sequence associated with the manufacturers. In one embodiment, processor 12 presents an interface to a user, e.g., a system administrator, to receive input identifying one of a plurality of memory manufactures, and generates configuration data 23 based on the input.

Upon determining the initialization sequence to be invoked, initialization control unit 22 instructs interface logic 24 to issue a first initialization command of the programmed sequence to modules 16. To issue a given command to interface logic 24, initialization control unit 22 provides precharge signal 34, mode signal 36, and command (CMD) 38 to interface logic 24. In particular, initialization control unit 22 provides command 38 as a digital value that indicates the particular command to be issued to memory modules 16. Upon outputting command 38, initialization control unit 22 asserts either precharge signal 34 or mode signal 36 to indicate the presence of the new command, depending on the type of command being issued. In particular, initialization control unit 22 asserts precharge signal 34, e.g., sets the bit to high or a logic value of one, to indicate that a PRECHARGE command is present on command lines 38 for issuance to memory modules 16. Alternatively, initialization control unit 22 sets mode signal 36 when the current command to be issued relates to the delay lock loop, e.g., a DLL ENABLE, a DLL RESET, or a DLL RESET DE-ASSERT.

In response, interface logic 24 logic 24 relays command 38, along with control signals 40, to memory modules 16. Control signals 40 may include, for example, four bits that represent a Chip Select (CS) signal, a Row Address Strobe (RAS) signal, a Column Address Strobe (CAS) signal, and a Write ENABLE (WE) signal set to indicate a particular command to execute. As one example, when issuing a PRECHARGE command, interface logic 24 may generate control bits having a bit pattern of 0010, thereby asserting the CAS bit and de-asserting the CS bit, the RAS bit, and the WE bit.

Depending upon the particular memory architecture of system 10 (FIG. 1), interface logic 24 may issue initialization command 38 to a single memory module 16, a subset of memory modules 16, or all of memory modules 16. Further, interface logic 24 may issue a first command to a subset of memory modules 16 and a second command to another subset of memory modules 16. In this case, initialization control unit 22 may provide more than one initialization command 38 in parallel to interface logic 24 for distribution to memory modules 16.

Interface logic 24 asserts precharge complete signal (PC_COMP) 44 or mode complete signal (MODE_COMP) 46, depending on the command, to indicate that the command has successfully been applied to memory modules 16.

To output a REFRESH command, initialization control unit 22 asserts refresh signal 50 to direct refresh controller 25 to initiate refresh cycles for memory modules 16. Refresh controller 25 assets refresh command complete (REFRESH COMP) signal, and begins periodically refreshing memory modules 16. In particular, refresh controller 25 periodically issues an execute refresh (EX_REFRESH) signal 53 to interface logic 24. Interface logic 24 relays EX_REFRESH signal 53 to memory modules 16, which execute a refresh to keep the content of memory modules 16 active.

Upon detecting the completion of a command, i.e., upon detecting the assertion of precharge complete signal 44, mode complete signal 46, or refresh complete signal 52, state machine 30 transitions to the next state based on configuration data 23, and outputs another command 38. In this manner, initialization control unit instructs interface logic to issue a subsequent command to modules 16 based on the programmed sequence. Initialization control unit 22 continues this process until all of the commands of the programmed sequence have been successfully issued, or an error is encountered.

Upon completing all of the commands of the initialization sequence, initialization control unit 22 outputs a done signal (DONE) 54 to indicate that the initialization sequence is has completed and that no errors occurred during the process. If, however, initialization control unit 22 detects any error during the initialization sequence, the controller asserts error signal 56 to report the occurrence. For example, initialization control unit 22 may assert error signal 56 when one or more memory modules 16 fail to respond to a command within a defined time period.

Initialization control unit 22 further includes a reset input 58 that resets initialization control unit 22, i.e., restarts the initialization process. RESET input 58 may be used, for example, to force initialization control unit 22 to dynamically re-initialize memory modules 16 without rebooting or resetting the other components within computing system 10.

Figure 3:
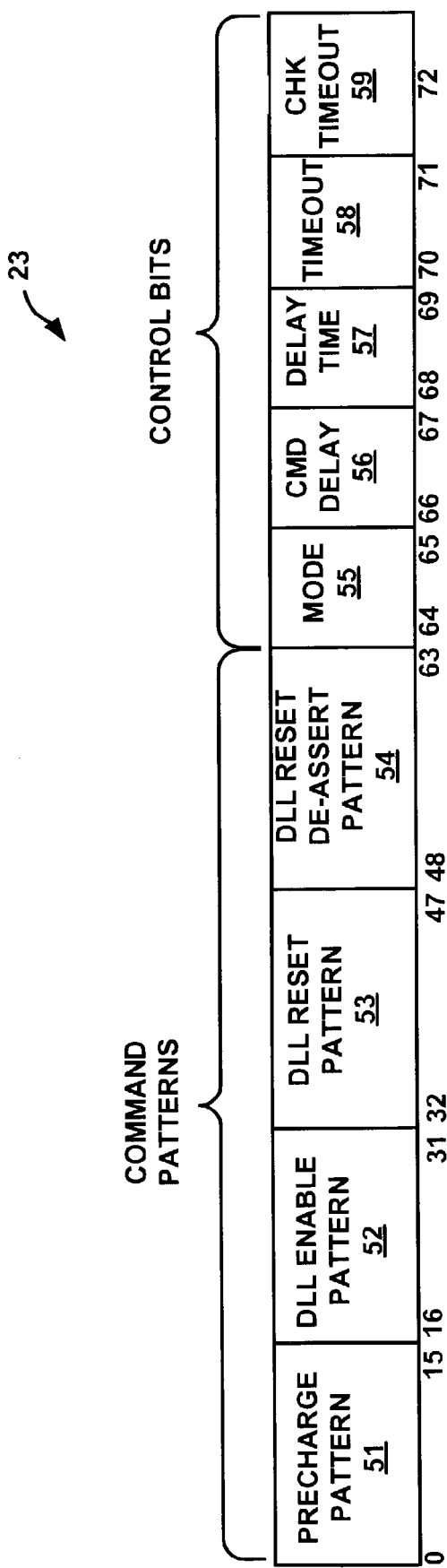
FIG. 3 is an exemplary data structure of configuration data received by the initialization control unit for programmatically controlling the initialization sequence.

FIG. 3 is an exemplary data structure of configuration data 23 received by initialization control unit 22 and stored in register 28 for programmatically controlling the initialization sequence. As illustrated, configuration data 23 may comprise a binary string that includes a number of fields 51–59.

In general, fields 51–54 allow processor 12 to specify particular bit patterns to be applied to memory modules 16 for each command. In other words, processor 12 may tailor the exact binary pattern issued to memory modules 16 for each command. Consequently, programmable memory controller 14 provides a high-level of programmable control over the individual commands. Fields 55–59 comprise initialization control bits for controlling specific properties of the initialization sequence carried out by initialization control unit 22 and, more particularly, state machine 30.

By way of example, field 51 may be a 16-bit field that defines a bit pattern issued by initialization control unit 22 for the PRECHARGE command. Field 52 may be a 16-bit field that defines a bit pattern for DLL ENABLE command. Field 53 may be 16-bit field that defines a bit pattern for the DLL RESET command. Field 53 may further define operating parameters used by memory modules 16 during the RESET command. Field 54 may be a 16-bit field that defines a bit pattern for the DLL RESET DE-ASSERT command, including the operating parameters programmed by memory modules 16. In this manner, fields 51–54 define the particular commands issued to memory modules 16 throughout the initialization sequence.

These commands are described for exemplary purposes, and configuration data 23 may include fields defining these or other commands for use during the initialization sequence. In addition, configuration data 23 may further include multiple sets of these bit patterns, e.g., fields 51–54, for issuance to different memory modules 16. As an example, a first set of commands may be issued to a first portion of memory modules 16, and a second set of commands may be issued to a second portion of the memory modules.

Initialization control bits of fields 55–59 are used to control various properties of the initialization sequence. For example, control bits of fields 55–59 may be used to programmatically change the order and timing of initialization commands of an initialization sequence. By way of example, field 55 may be a 2-bit mode field with which processor 12 directs initialization control unit 22 to select a specific one of a plurality of predefined initialization sequences. By setting mode field 55, processor 12 may select a particular sequence of commands suitable for a particular manufacturer of memory modules 16. As described above, the order of the commands of the initialization sequence may differ slightly from manufacturer to manufacturer, or from product to product from a particular manufacturer. In one embodiment, mode field 55 contains two bits and allows processor 12 to select one of four predefined initialization sequences as illustrated in Table 1.

TABLE 1

| MODE | PREDEFINED SEQUENCE |
|---|---|
| 00 | PRECHARGE, DLL ENABLE, DLL RESET, PRECHARGE, REFRESH DLL RESET DE-ASSERT, DELAY |
| 01 | PRECHARGE, DLL ENABLE, DLL RESET, DLL RESET DE-ASSERT, PRECHARGE, REFRESH, DELAY |
| 10 | PRECHARGE, DLL ENABLE, DLL RESET, DELAY, PRECHARGE, REFRESH, DLL RESET DE-ASSERT |
| 11 | PRECHARGE, DLL ENABLE, DLL RESET, DELAY, DLL RESET DE-ASSERT, PRECHARGE, REFRESH |

Field 56 is a command delay field that allows processor 12 to configure initialization control unit 22 to wait an additional number of cycles after a command completes before issuing a subsequent command. By requiring such a delay, processor 12 can direct initialization control unit 22 to slow the initialization processes, as may be required for certain types of memory modules 16. By setting the command delay field 56 to zero, processor 12 can direct initialization control unit 22 to operate as fast as possible, i.e., without any extra delay. In one embodiment, command delay field 56 comprises two bits, and processor 12 may select one of four predefined number of extra cycles as illustrated in Table 2.

TABLE 2

| CMD DELAY | EXTRA DELAY BETWEEN COMMANDS |
|---|---|
| 00 | 0 EXTRA CYCLES |
| 01 | 4 EXTRA CYCLES |
| 10 | 16 EXTRA CYCLES |
| 11 | 63 EXTRA CYCLES |

Field 57 allows processor 12 to programmatically set the amount of time to stall upon applying the DELAY command during the initialization sequence. In one embodiment, delay time field 57 comprises two bits, and processor 12 may select one of the four predefined delay periods, as illustrated in Table 3.

TABLE 3

| CMD DELAY | DURATION OF DELAY COMMAND |
|---|---|
| 00 | 128 CYCLES |
| 01 | 200 CYCLES |
| 10 | 512 CYCLES |
| 11 | 1024 CYCLES |

Field 58 allows processor 12 to programmatically set an amount of time to wait for a response to a command before issuing a timeout error. When a response to a command is not received within the specified number of cycles selected by timeout error field 58, initialization control unit 22 reports a timeout error. Such an error may, for example, indicate that there is a problem with interface logic 24, one or more memory modules 16, or both. A value of zero within timeout error field 58 disables the timeout functionality. In one embodiment, timeout error field 57 comprises two bits, and processor 12 may select one of four predefined timeout periods, as illustrated in Table 4.

TABLE 4

| CMD DELAY | TIMEOUT PERIOD |
| --- | --- |
| 00 | DISABLED |
| 01 | 128 CYCLES |
| 10 | 1024 CYCLES |
| 11 | 4095 CYCLES |

Finally, field 59 of configuration data 23 is a 1-bit field by which processor 12 can direct initialization control unit 22 to check for timeout errors during refreshes using the timeout period defined by field 58. If the bits of field 58 indicate disable the timeout functionality, than initialization control unit 22 will not report timeout errors during refresh.

Figure 4:
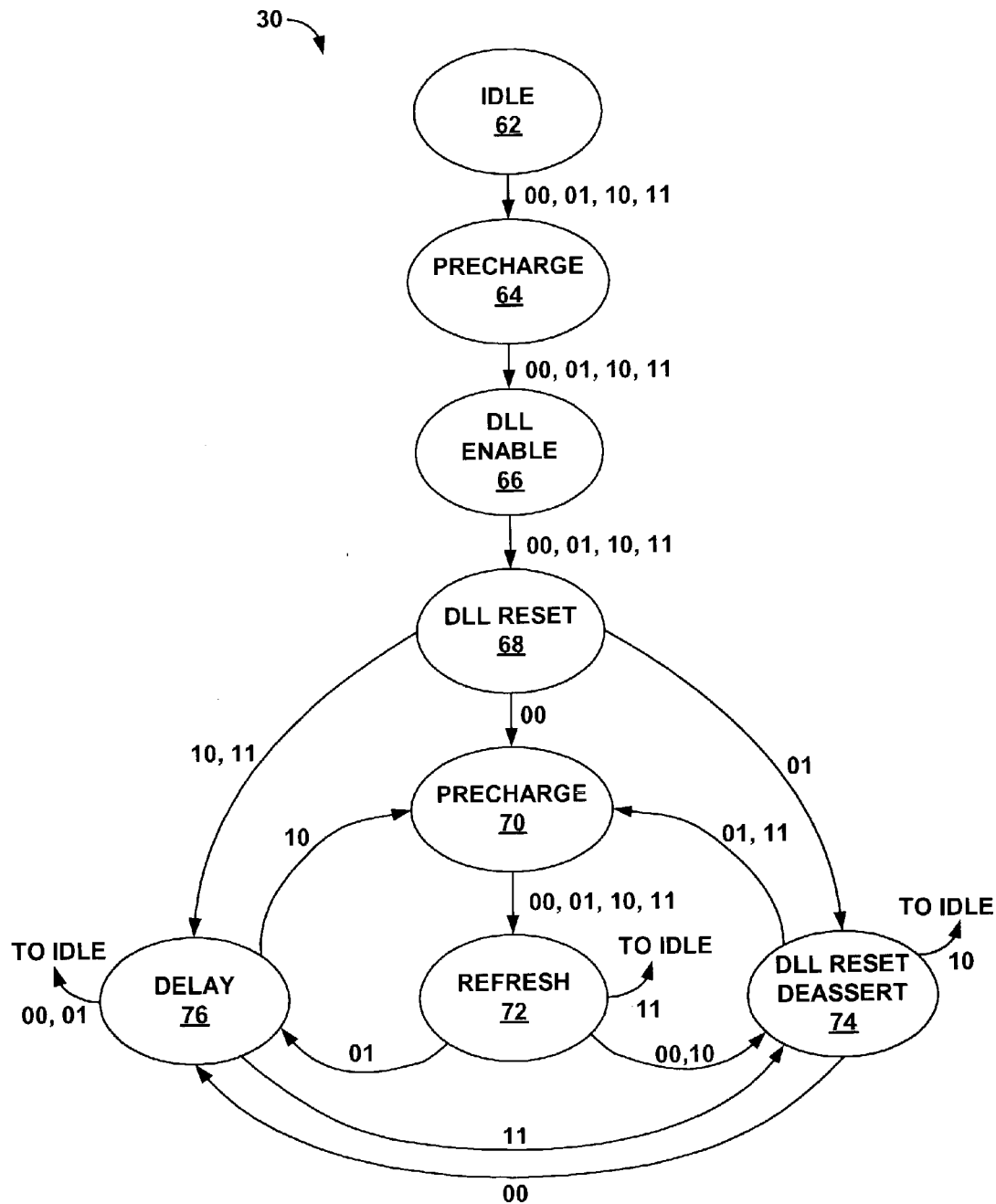
FIG. 4 is a block diagram illustrating an exemplary state machine that controls the issuance of initialization commands to a memory module in accordance with a number of predefined initialization sequences.

FIG. 4 is a block diagram illustrating an exemplary state machine 30 that controls the issuance of initialization commands to memory modules 16 in accordance with a number of predefined initialization sequences. As illustrated, state machine 30 includes a plurality of states that generally correspond to respective commands of the initialization sequence. State machine 30 transitions through the states in accordance with configuration data 23 of register 28 to issues a particular sequence of commands. For example, state machine 30 may select an initialization sequence from a plurality of predefined initialization sequences based on mode field 55 (FIG. 3), and transitions through the various states based on the value of the field.

In the example of FIG. 4, initialization control unit 22 may select one of four predefined initialization sequences in accordance with the data stored in register 28 and, more specifically, with the 2-bit mode field 55. Based on the value of mode field 55, state machine 33 issues the commands in accordance with one of the predefined sequences illustrated in Table 1.

Due to commonality of the sequences, the first four states of state machine 30 remain the same regardless of the selected initialization sequence. More specifically, upon completion of power-up, state machine 30 enters an idle state 62. State machine 30 remains in IDLE state 62 until initialization control unit 22 receives start signal 32. Upon receiving start signal 32, state machine 30 accesses mode field 55, and initiates the programmatically selected sequence by transitioning to a first state of the initialization sequence, i.e., PRECHARGE state 64.

When state machine 30 enters precharge state 64, initialization control unit 22 directs interface logic 24 to issue the PRECHARGE command as described above. Specifically, initialization control unit 22 issues the precharge bit pattern stored in field 51, and waits for an assertion of the precharge complete signal 44. Interface logic 24 relays the specified PRECHARGE bit pattern to memory modules 16, causing the memory modules deactivate any open rows of the memory modules.

Once initialization control unit 22 detects an assertion of precharge complete signal 44, state machine 30 transitions the next state of the initialization sequence, i.e., DLL ENABLE state 66. Prior to transitioning to DLL ENABLE state 66, state machine 30 may wait a defined number of cycles in accordance with field 56. Upon transitioning to DLL ENABLE state 56, initialization control unit 22 accesses field 52 and issues the DLL ENABLE bit pattern stored therein to interface logic 24 for issuance to memory modules 16. As with the PRECHARGE command, interface logic 24 relays the bit pattern to memory modules 16, and relays any response to initialization control unit 22.

Once initialization control unit 22 receives an indication that the DLL ENABLE command has completed, e.g., via mode complete signal 46, state machine 30 enters a DLL RESET STATE 68. In this state, initialization control unit 22 communicates the bit pattern stored in field 53, causing interface logic 24 to issue the DLL RESET command and other operating parameters to memory modules 16.

Upon completion of the DLL RESET command, state machine 30 transitions to the next state of the initialization sequence in accordance with the selected sequence. As illustrated in Table 1, the next state may differ depending on mode field 55. By way of example, when the 2-bit mode field is 00, state machine 30 issues the remaining commands by transitioning through a PRECHARGE state 70, followed by a REFRESH state 72, a DLL RESET DE-ASSERT state 74, a DELAY state 76, and back to IDLE state 62.

If the 2-bit state mode field is 01, the subsequent commands of the initialization sequence are the same commands, but in a slightly different order. For example, a state mode field of 01 causes state machine 30 to issue a different sequence of commands by transitioning from DLL RESET state 68 through DLL RESET DE-ASSERT state 74, PRECHARGE state 70, REFRESH state 72, DELAY state 76, and back to IDLE state 62.

The initialization sequences selected by state mode fields 10 and 11, as with state mode 01, include the same commands as the initialization sequence selected by mode 00, but in accordance with third and fourth predefined sequences. More specifically, state mode 10 causes state machine 30 to issue a different sequence of commands by transitioning from DLL RESET state 68 through DELAY state 76, PRECHARGE state 70, REFRESH state 72, DLL RESET DE-ASSERT state 74, and back to IDLE state 62. State mode 11 causes state machine 30 to issue a different sequence of commands by transitioning from DLL RESET state 68 through DELAY state 76, DLL RESET DE-ASSERT state 74, a PRECHARGE state 70, a REFRESH state 72, and back to IDLE state 62.

In this manner, state machine 30 may be programmatically controlled to issue commands in accordance with one of a number of predefined sequences. While transitioning between states, state machine 30 controls the timing and duration of the commands based on control bits 64–72 of configuration data 23, e.g., CMD DELAY 56 and DELAY TIME 57, as described above.

Although not illustrated in the example of FIG. 4 for purposes of clarity, state machine 30 may transition to IDLE state 62 from any of the other states upon receiving a reset signal 58.

Although in the example of FIG. 4 the first three states are the same for each initialization sequence selected, state machine 30 may be configured to arrange the order of progression through the states of the initialization sequence in any order. Further, initialization sequences may exclude any of the states or include states more than once. Additional states may also be added to state machine 30.

Figure 5:
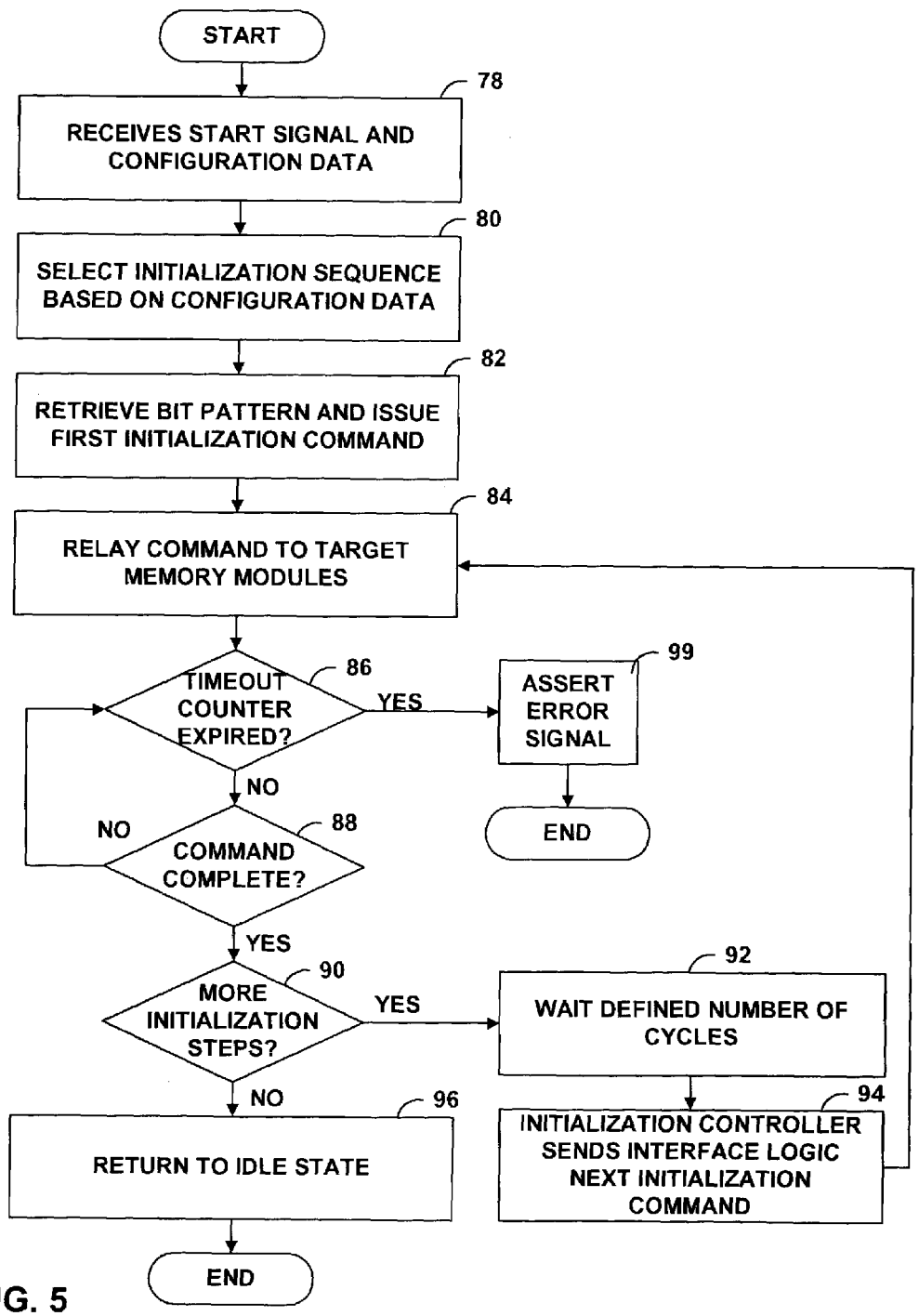
FIG. 5 is a flow diagram illustrating an exemplary mode of operation of the programmable memory controller.

FIG. 5 is a flow diagram that illustrates example operation of memory controller 14 when initializing memory modules 16 in accordance with programmable configuration data 23. Initially, initialization control unit 22 receives a start signal 32 and configuration data 23 from microprocessor 12 (78). In response, initialization control unit 22 stores configuration data 23 in register 28, and selects a particular initialization sequence from a set of predefined initialization sequences (80). Initialization control unit 22 may, for example, access register 28 and select the initialization sequence based on mode field 55.

Next, initialization control unit 22 retrieves from register 28 a bit pattern for a first initialization command of the sequence, and issues the command to interface logic 24 for relaying to memory modules 16 (82). In response, interface logic 24 issues the bit pattern initialization command to one or more target memory modules 16 (84). Interface logic 24 may, for example, issue the initialization command to each of memory modules 16. Alternatively, interface logic 24 may issue a first portion of the command to a subset of memory modules 16, and a second portion of the command to a second subset of memory modules 16. In this manner, initialization control unit 22 may issue different commands to different memory modules 16, e.g., different memory banks. For example, a portion of the memory modules 16 may be used for main storage while the other portion of memory modules 16 may be used for directory storage.

Upon issuing the command to interface logic 24, initialization control unit 22 initiates a timer for receiving a response. More specifically, initialization control unit 22 may initiate the timer to time a duration specified in TIMEOUT field 58. If the timer expires (86), initialization control unit 22 and, more particularly, state machine 30 reports an error via error signal 56 (99).

If the timeout counter has not expired or in disabled, initialization control unit 22 waits for an indication that the issued command has been completed, e.g., via assertion of mode complete signal 46, precharge complete signal 44, or refresh complete signal 52 (88). When one of these signals is received (88), initialization control unit 22 determines whether there are more commands in the initialization sequence (90). When there are no more initialization commands in the sequence, the initialization sequence is complete and initialization control unit 22 returns to an idle state (96).

When there are more commands in the initialization sequence, initialization control unit 22 may wait a defined number of cycles before the next command (92). The number of cycles initialization control unit 22 waits before the next command of the sequence may be specified by CMD DELAY field 56 of configuration data 23. Upon waiting the defined number of cycles, initialization control unit 22 informs interface logic 24 to start the next initialization command in the sequence (94). Interface logic issues the command to memory modules 16, as described above (84).

Various embodiments of the invention have been described. These and other embodiments are within the scope of the following claims.

The invention claimed is:

1. A method comprising:
    receiving programmable configuration data that specifies a respective bit pattern for each of a plurality of commands;
    storing the programmable configuration data and the bit patterns within a programmable memory controller;
    selecting one of a plurality of predefined initialization sequences based on the programmable configuration data, wherein the plurality of predefined initialization sequences specify different orders for applying a precharge command, a delay lock loop enable command, delay lock loop (DLL) reset command, a DLL reset de-assert command, a delay command, and a refresh command; and
    issuing the commands from the programmable memory controller to initialize a memory module in accordance with the selected initialization sequence, wherein issuing the commands comprises issuing the respective, stored bit pattern for each of the commands as specified by the programmable configuration data.

2. The method of claim 1, wherein selecting an initialization sequence comprises:
    accessing the programmable configuration data to retrieve a specified mode;
    associating the mode with one of the initialization sequences; and
    selecting the associated initialization sequence.

3. The method of claim 1, wherein at least one of the initialization sequences specifies an additional command not specified within the other initialization sequences, and issuing the commands comprises issuing the additional command.

4. The method of claim 1, wherein the configuration data specifies timing information for the selected initialization sequence, and issuing the commands comprises issuing the commands in accordance with the timing information.

5. The method of claim 4, wherein the timing information specifies a time delay, and issuing the commands comprises delaying for at least the specified time delay between issuing successive commands for the selected initialization sequence.

6. The method of claim 4, wherein the timing information specifies a timeout value, and issuing the commands comprises:
    initiating a timer in accordance with the specified timeout value upon issuing each of the commands; and
    generating an error signal when the timer expires prior to receiving a completion signal for each issued command.

7. The method of claim 4, wherein the timing information specifies respective durations for one or more of the commands, and issuing the commands comprises issuing the commands for the respective durations specified by the timing information of the configuration data.

8. The method of claim 1, wherein issuing the commands comprises:
    issuing a first command to the memory module based on the selected initialization sequence;
    receiving a signal indicating completion of the first command;
    selecting a subsequent command based on the selected initialization sequence upon receiving the completion signal; and
    issuing the subsequent command to the memory module.

9. The method of claim 1, further comprising outputting a signal to indicate completion of the selected initialization sequence.

10. The method of claim 1, further comprising:
    receiving a reset signal during operation of a computing system;
    re-issuing the commands to the memory module without requiring that power be removed from other components of the computing system.

11. The method of claim 1, wherein receiving programmable configuration data comprises receiving the programmable configuration data from a microprocessor.

12. The method of claim 1, wherein the initialization sequences correspond to different memory manufacturers, and selecting the initialization sequence comprises selecting the initialization sequence based on a manufacturer code defined within the configuration data.

13. The method of claim 1, wherein issuing the commands comprises issuing the commands to initialize a Dual Inline Memory Module (DIMM).

14. A memory controller comprising:
a programmable computer-readable medium that stores configuration data to control initialization of one or more memory modules; and
an initialization control unit that outputs a sequence of commands to initialize the memory modules in accordance with the configuration data,
wherein the initialization control unit outputs at least subsets of the following commands in different orders based on the configuration data: a precharge command, a delay lock loop enable command, delay lock loop (DLL) reset command, a DLL reset de-assert command, and a refresh command.

15. The memory controller of claim 14, further comprising interface logic to relay the commands to the memory modules.

16. The memory controller of claim 14, wherein the initialization control unit selects an initialization sequence from a plurality of stored initialization sequences based on the configuration data, and generates the commands in accordance with the selected initialization sequence.

17. The memory controller of claim 16, wherein each of the stored initialization sequences specifies a different order for the commands, and the initialization control unit issues the commands in accordance with the order specified by the selected initialization sequence.

18. The memory controller of claim 16, wherein at least one of the stored initialization sequences specifies an additional command not specified within the other initialization sequences.

19. The memory controller of claim 14, wherein the configuration data specifies timing information, and the initialization control unit issues the commands in accordance with the timing information.

20. The memory controller of claim 19, wherein the timing information specifies a time delay, and the initialization control unit delays for at least the specified time delay between issuing successive commands.

21. The memory controller of claim 19, wherein the timing information specifies respective durations for one or more of the commands, and the initialization control unit issues the commands for the respective durations specified by the timing information of the configuration data.

22. The memory controller of claim 14, further comprising a programmable timer, wherein the initialization control unit loads the timer with a timeout value specified by the configuration data and starts the timer upon issuing each of the commands, and wherein the initialization control unit generates an error signal when the timer expires prior to receiving a completion signal for each issued command.

23. The memory controller of claim 14, further comprising an input to receive the configuration data for storage within the computer-readable medium.

24. The memory controller of claim 14, wherein the computer-readable medium comprises a register.

25. The memory controller of claim 14, wherein the configuration data specifies bit patterns for the commands, and the initialization control unit issues the specified bit patterns for the commands.

26. The memory controller of claim 14, wherein the memory modules comprise Dual Inline Memory Modules (DIMMs).

27. A system comprising:
a memory module;
a programmable memory controller; and
a processor to provide configuration data to the memory controller to control initialization of the memory module,
wherein the configuration data provided by the processor includes a respective bit pattern for each of a plurality of commands,
wherein the memory controller stores the configuration data, the bit patterns, and a plurality of initialization sequences that define different sequences for the commands,
wherein the plurality of initialization sequences specify different orders for applying a precharge command, a delay lock loop enable command, delay lock loop (DLL) reset command, a DLL reset de-assert command, a delay command, and a refresh command,
wherein the memory controller selects one of the stored initialization sequences based on the configuration data, and outputs the commands in accordance with the selected initialization sequence, and
wherein the memory controller outputs the commands by outputting the respective, stored bit pattern for each of the commands.

28. The system of claim 27, wherein the processor presents an interface to receive input identifying one of a plurality of memory manufactures, and generates the configuration data based on the input.

29. The system of claim 27, wherein the memory controller includes a state machine to control the output of the commands in accordance with the selected initialization sequence.

30. The system of claim 27, wherein the memory module comprises a Dual Inline Memory Module (DIMM).

31. A system comprising:
a memory module;
means for receiving configuration data that specifies a respective bit pattern for each of a plurality of commands;
a programmable computer-readable medium to store the received configuration data and bit patterns;
means for selecting a sequence of the commands from a set of predefined initialization sequences based on stored configuration data, wherein the set of predefined initialization sequences specify different orders for applying a precharge command, a delay lock loop enable command, delay lock loop (DLL) reset command, a DLL reset de-assert command, a delay command, and a refresh command; and
means for issuing the commands to the memory module in accordance with the selected initialization sequence to initialize the memory module, wherein the issuing means issues the commands by issuing the respective, stored bit patterns for each of the commands in accordance with the configuration data.

32. The system of claim 31, wherein the memory module comprises a Dual Inline Memory Module (DIMM).

* * * * *